(12) United States Patent
Hodges

(10) Patent No.: US 12,596,401 B1
(45) Date of Patent: Apr. 7, 2026

(54) MOBILE DEVICE THERMALLY INSULATING PROTECTIVE COVER

(71) Applicant: Jennifer Hodges, Laguna Niguel, CA (US)

(72) Inventor: Jennifer Hodges, Laguna Niguel, CA (US)

( * ) Notice: Subject to any disclaimer, the term of this patent is extended or adjusted under 35 U.S.C. 154(b) by 0 days.

(21) Appl. No.: 19/259,406

(22) Filed: Jul. 3, 2025

(51) Int. Cl.
 *G06F 1/16* (2006.01)
 *G06F 1/20* (2006.01)
 *H05K 7/20* (2006.01)

(52) U.S. Cl.
 CPC ............ *G06F 1/1629* (2025.01); *G06F 1/203* (2013.01); *H05K 7/20454* (2013.01)

(58) Field of Classification Search
 CPC ..... A45C 11/00; A45C 13/005; A45C 11/001; A45C 13/02; A45C 11/002; A45C 11/003; A45C 13/1084; A45C 11/20; A45C 2005/037; A45C 2013/025; A45C 5/03; A45C 7/00; A45C 9/00; H04B 1/3888; H04R 1/02; A45F 3/02; A45F 5/1508; B65D 81/3813; B65D 81/3876; B65D 7/28; H04M 1/0214; H04M 1/185; H04M 1/03; H04M 1/0206; H04M 1/04; H05K 9/0045; H05K 9/0047; H05K 13/04; H05K 7/20436; H05K 7/20454; A45D 33/006; A45D 40/221; F25D 3/08; G06F 1/1628; G06F 1/1633; G06F 1/203; G06F 1/206; G06F 2200/1633; G06F 2200/203; G06F 1/1629
 See application file for complete search history.

(56) References Cited

U.S. PATENT DOCUMENTS

| | | | | |
|---|---|---|---|---|
| 9,049,283 | B1 * | 6/2015 | Kim | H04M 1/21 |
| 9,467,190 | B1 * | 10/2016 | Cramer | F21L 4/00 |
| 9,768,822 | B1 * | 9/2017 | Loh | H04B 1/3888 |
| 2011/0228458 | A1 * | 9/2011 | Richardson | A45C 11/00 |
| | | | | 361/679.01 |
| 2012/0018323 | A1 * | 1/2012 | Johnson | H04B 1/3888 |
| | | | | 206/320 |
| 2012/0118773 | A1 * | 5/2012 | Rayner | G06F 1/1637 |
| | | | | 206/320 |
| 2013/0063004 | A1 * | 3/2013 | Lai | G06F 1/182 |
| | | | | 312/223.1 |

(Continued)

OTHER PUBLICATIONS

Case With Two Bodies for Protecting Portable Electronic Device; Kim Dae Young; PE2E English translation (Year: 2014).*

*Primary Examiner* — Michael A Matey
(74) *Attorney, Agent, or Firm* — Pharar Patents & Intellectual Property; Andrew A. Pharar

(57) ABSTRACT

The mobile device thermally insulating protective cover may provide effective thermal protection without sacrificing portability, ease of use, or functional access. The present invention addresses this need by providing a novel solution that combines thermal insulation with physical protection in a form factor suitable for everyday use. The mobile device thermally insulating protective cover may use a combination of passive and active features that allow a mobile device to be cooler when sitting in direct sunlight for prolonged periods of time, preventing a risk of the mobile device being inoperable due to temporary overheating. The inside of the device may comprise cooling channels built into the material, which may also act as shock absorption.

5 Claims, 19 Drawing Sheets

(56)          References Cited

U.S. PATENT DOCUMENTS

2014/0190841 A1* 7/2014 Nash .................... H05K 9/0045
                                                        206/37
2015/0207911 A1* 7/2015 Lin ....................... H04M 1/035
                                                        455/569.1
2021/0184476 A1* 6/2021 Zeng ................... H01F 27/2876
2022/0209809 A1* 6/2022 Wright ................ A45C 11/003

* cited by examiner

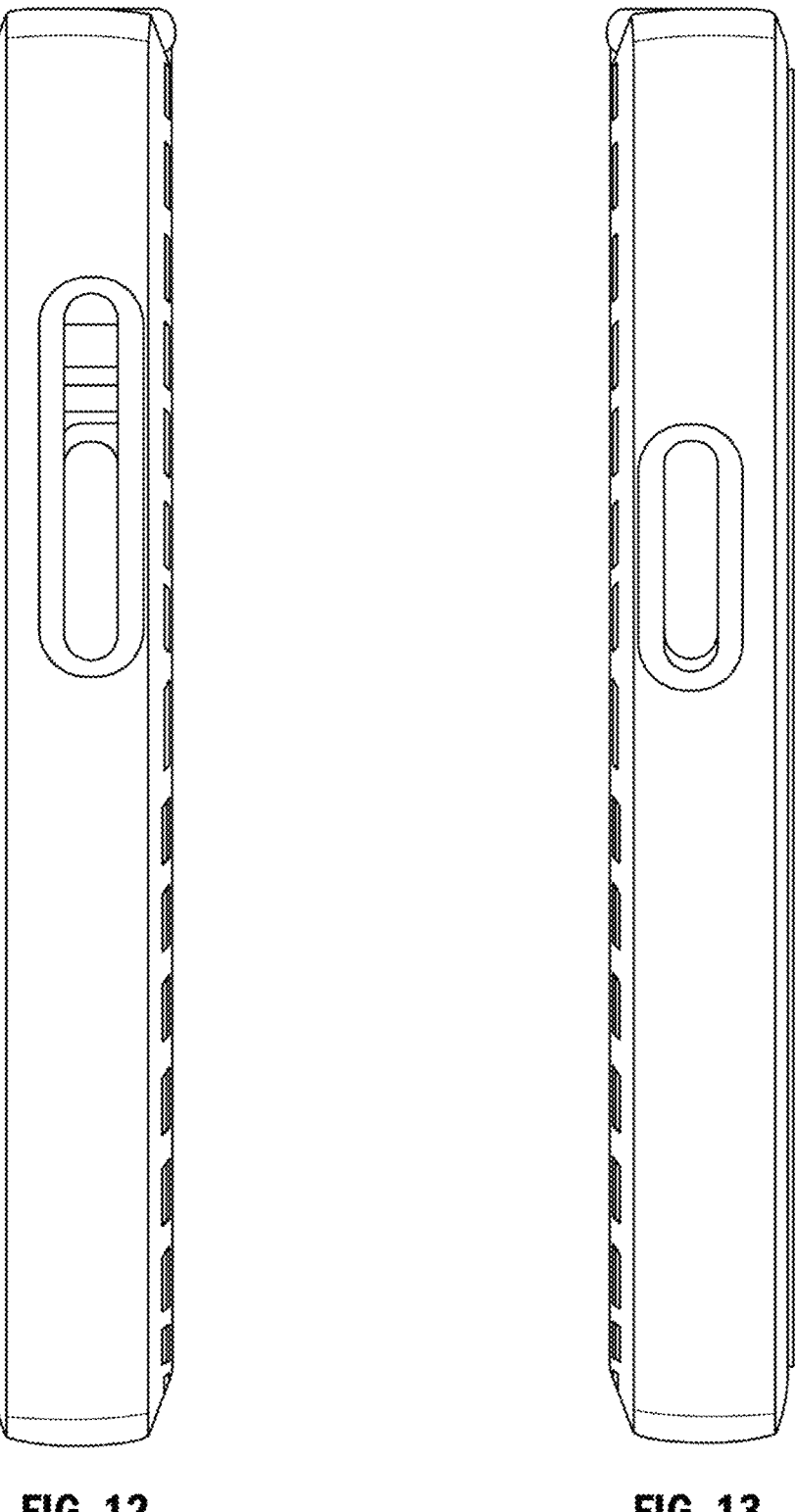
FIG. 12          FIG. 13

102

118

120

MOBILE DEVICE THERMALLY INSULATING PROTECTIVE COVER

TECHNICAL FIELD OF THE INVENTION

The present invention relates in general to mobile device covers, and, more specifically, to a mobile device thermally insulating protective cover.

COPYRIGHT AND TRADEMARK NOTICE

A portion of the disclosure of this patent application may contain material that is subject to copyright protection. The owner has no objection to the facsimile reproduction by anyone of the patent document or the patent disclosure, as it appears in the Patent and Trademark Office patent file or records, but otherwise reserves all copyrights whatsoever.

Certain marks referenced herein may be common law or registered trademarks of third parties affiliated or unaffiliated with the applicant or the assignee. Use of these marks is by way of example and should not be construed as descriptive or to limit the scope of this invention to material associated only with such marks.

BACKGROUND OF THE INVENTION

Mobile electronic devices have become ubiquitous in modern society, serving as essential tools for communication, navigation, entertainment, and productivity. As their usage increases in a wide variety of environments, the demand for effective protective accessories has grown in parallel. Conventional protective cases are primarily designed to shield devices from physical damage such as impacts, scratches, and dust. While such cases provide mechanical protection, they are generally not engineered to address thermal exposure, which can significantly affect the performance, longevity, and safety of mobile devices.

Mobile devices are sensitive to temperature extremes. Exposure to elevated temperatures can lead to battery degradation, reduced device performance, screen discoloration, and even catastrophic failure in extreme cases. Conversely, exposure to cold environments can impair battery efficiency, slow processing speeds, and cause condensation upon reentry into warmer environments, potentially damaging internal components. Despite these risks, most commercially available protective cases provide little or no thermal insulation.

Existing attempts to address thermal issues typically involve active cooling mechanisms or heat sinks integrated into the device itself. However, these solutions are complex, costly, and consume additional power, which can reduce battery life. Passive insulation solutions, when available, are often bulky, lack durability, or interfere with device operation and usability, such as signal transmission or access to buttons and ports.

Thus, there is a need in the art for a mobile device thermally insulating protective cover that may provide effective thermal protection without sacrificing portability, ease of use, or functional access. The present invention addresses this need by providing a novel solution that combines thermal insulation with physical protection in a form factor suitable for everyday use. The mobile device thermally insulating protective cover may use a combination of passive and active features that allow a mobile device to be cooler when sitting in direct sunlight for prolonged periods of time, preventing a risk of the mobile device being inoperable due to temporary overheating. The inside of the device may comprise cooling channels built into the material, which may also act as shock absorption. It is to these ends that the present invention has been developed.

BRIEF SUMMARY OF THE INVENTION

To minimize the limitations in the prior art, and to minimize other limitations that will be apparent upon reading and understanding the present specification, the present invention describes a mobile device thermally insulating protective cover.

It is an objective of the present invention to provide a mobile device thermally insulating protective cover that may comprise a mobile device cover.

It is another objective of the present invention to provide a mobile device thermally insulating protective cover that may comprise a main body.

It is another objective of the present invention to provide a mobile device thermally insulating protective cover that may comprise a hard case.

It is another objective of the present invention to provide a mobile device thermally insulating protective cover that may comprise a hard lid.

It is another objective of the present invention to provide a mobile device thermally insulating protective cover that may comprise a double hinge joint.

It is another objective of the present invention to provide a mobile device thermally insulating protective cover that may comprise a plurality of hinges.

It is another objective of the present invention to provide a mobile device thermally insulating protective cover that may comprise a soft case.

It is another objective of the present invention to provide a mobile device thermally insulating protective cover that may comprise a soft lid.

It is another objective of the present invention to provide a mobile device thermally insulating protective cover that may comprise a plurality of cooling channels.

It is another objective of the present invention to provide a mobile device thermally insulating protective cover that may comprise a cooling layer.

It is another objective of the present invention to provide a mobile device thermally insulating protective cover that may comprise a graphite sheet.

It is another objective of the present invention to provide a mobile device thermally insulating protective cover that may comprise a hydrogel layer.

It is another objective of the present invention to provide a mobile device thermally insulating protective cover that may comprise an aluminum layer.

It is another objective of the present invention to provide a mobile device thermally insulating protective cover that may comprise a resilient material of construction.

It is another objective of the present invention to provide a mobile device thermally insulating protective cover that may comprise a water-proof material of construction.

It is another objective of the present invention to provide a mobile device thermally insulating protective cover that may comprise a reusable material of construction.

It is another objective of the present invention to provide a mobile device thermally insulating protective cover that may comprise a washable material of construction.

It is another objective of the present invention to provide a mobile device thermally insulating protective cover that may comprise a multi-component construction.

It is another objective of the present invention to provide a mobile device thermally insulating protective cover that may comprise an antimicrobial layer.

It is another objective of the present invention to provide a mobile device thermally insulating protective cover that may comprise an antimicrobial material of construction.

These and other advantages and features of the present invention are described herein with specificity so as to make the present invention understandable to one of ordinary skill in the art, both with respect to how to practice the present invention and how to make the present invention.

BRIEF DESCRIPTION OF THE SEVERAL VIEWS OF THE DRAWINGS

Elements in the figures have not necessarily been drawn to scale in order to enhance their clarity and improve understanding of these various elements and embodiments of the invention. Furthermore, elements that are known to be common and well understood to those in the industry are not depicted in order to provide a clear view of the various embodiments of the invention.

FIG. 12 is a right side elevation view of a mobile device thermally insulating protective cover, as contemplated by the present disclosure;

FIG. 13 is a left side elevation view of a mobile device thermally insulating protective cover, as contemplated by the present disclosure;

DETAILED DESCRIPTION OF THE INVENTION

Certain terminology is used in the following description for reference only and is not limiting. The words "front," "rear," "anterior," "posterior," "lateral," "medial," "upper," "lower," "outer," "inner," and "interior" refer to directions toward and away from, respectively, the geometric center of the invention, and designated parts thereof, in accordance with the present disclosure. Unless specifically set forth herein, the terms "a," "an," and "the" are not limited to one element, but instead should be read as meaning "at least one." The terminology includes the words noted above, derivatives thereof, and words of similar import.

The mobile device thermally insulating protective cover may provide effective thermal protection without sacrificing portability, ease of use, or functional access. The present invention addresses this need by providing a novel solution that combines thermal insulation with physical protection in a form factor suitable for everyday use. The mobile device thermally insulating protective cover may use a combination of passive and active features that allow a mobile device to be cooler when sitting in direct sunlight for prolonged periods of time, preventing a risk of the mobile device being inoperable due to temporary overheating. The inside of the device may comprise cooling channels built into the material, which may also act as shock absorption.

Figure 1:
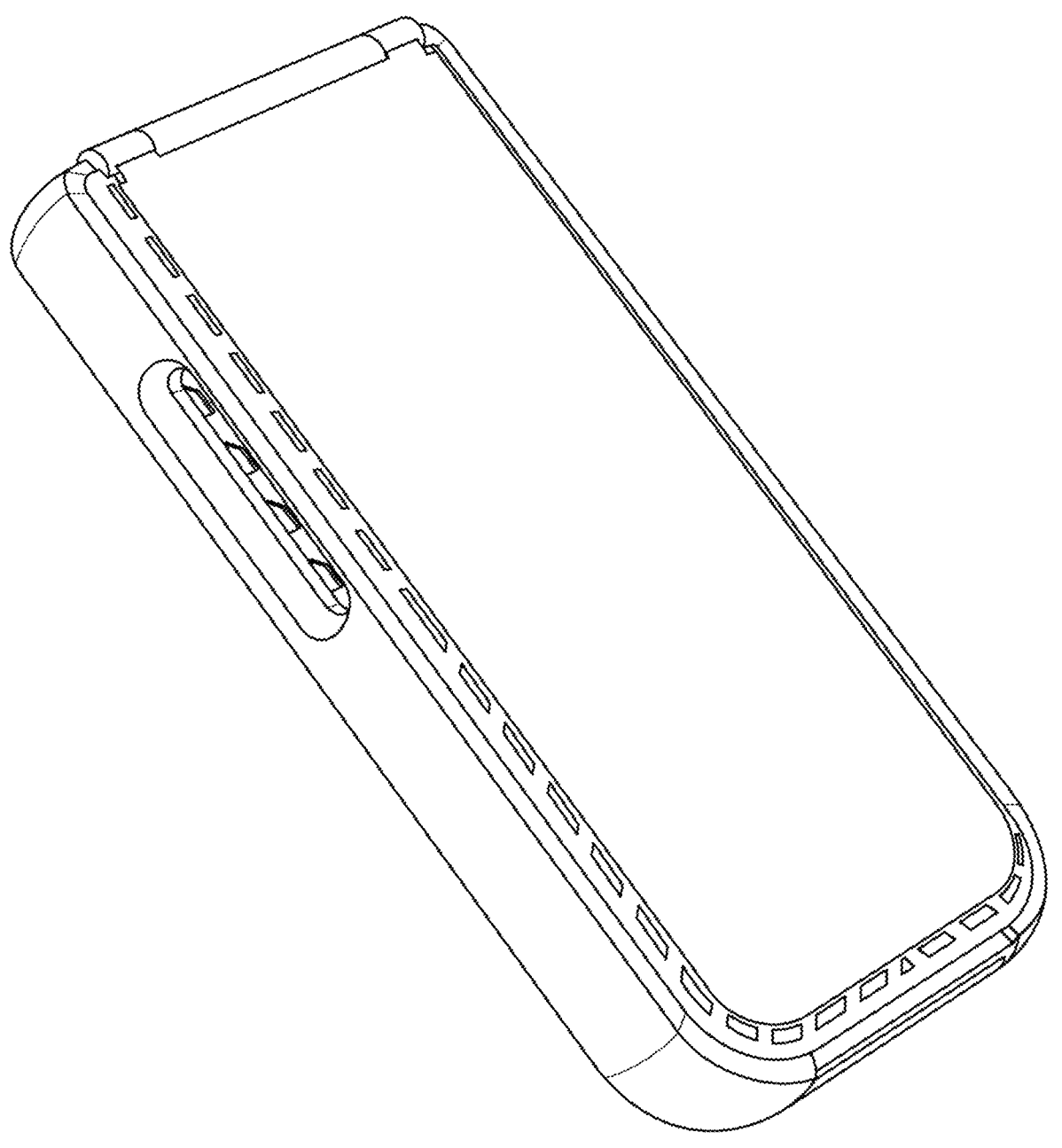
FIG. 1 is a front isometric perspective view of a mobile device thermally insulating protective cover with the hard lid closed, as contemplated by the present disclosure.
Figure 2:
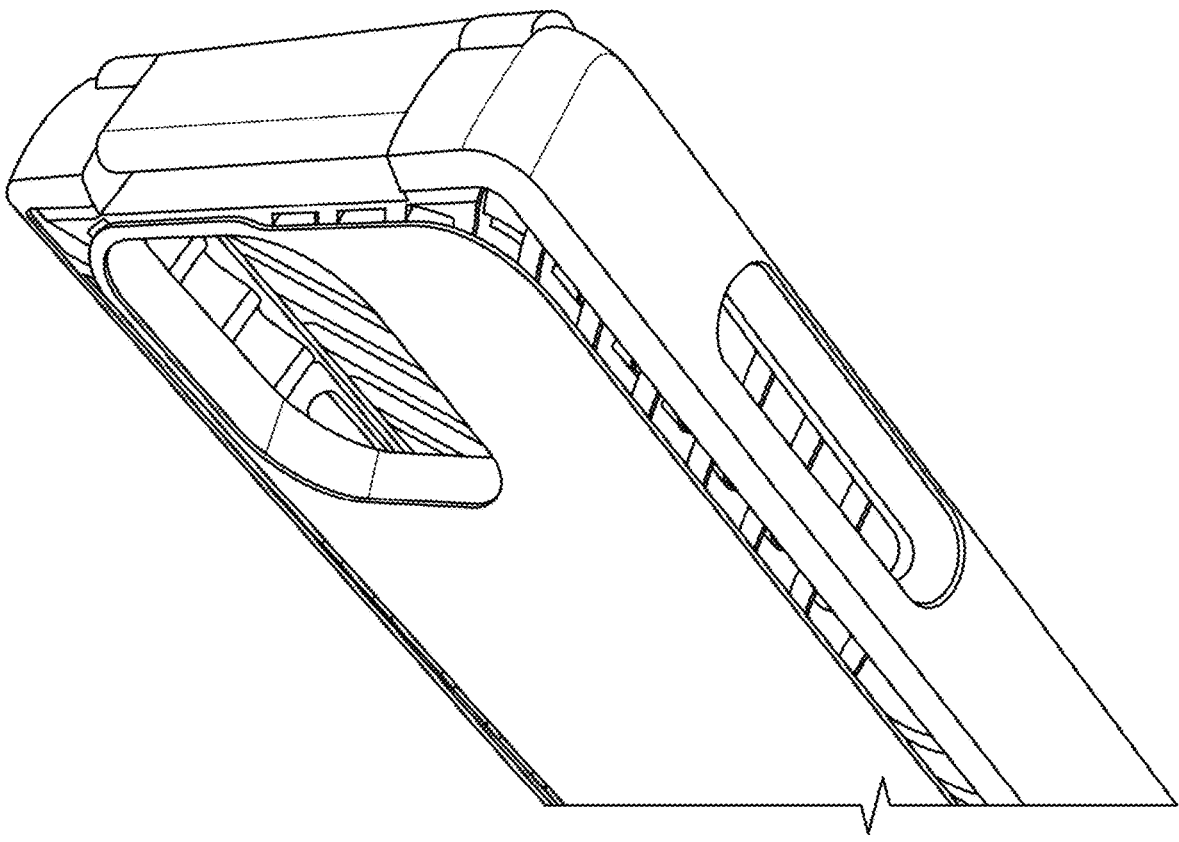
FIG. 2 is a rear isometric perspective view of a mobile device thermally insulating protective cover with the hard lid closed, as contemplated by the present disclosure.
Figure 3:
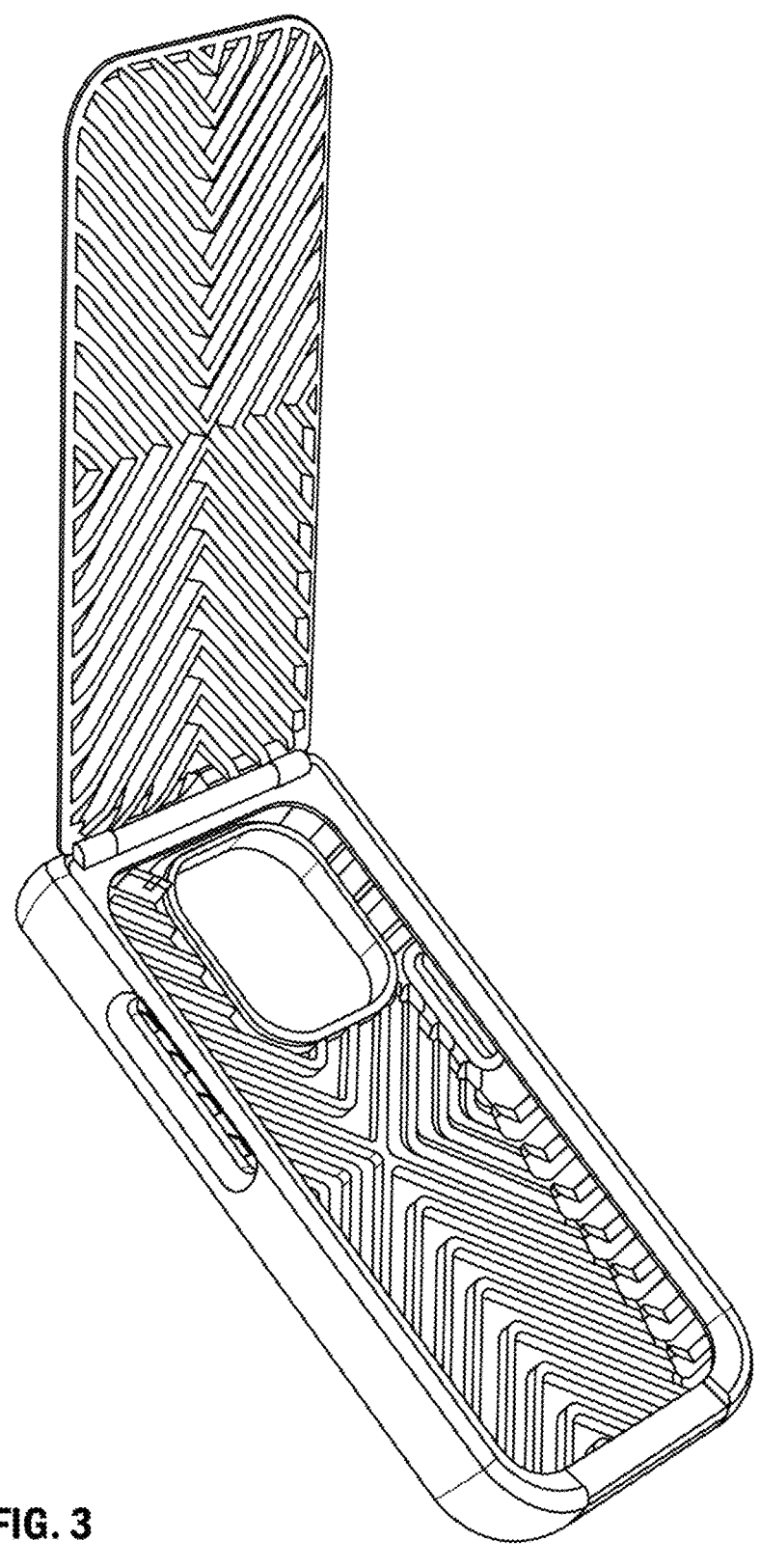
FIG. 3 is a front isometric perspective view of a mobile device thermally insulating protective cover with the hard lid partially open, as contemplated by the present disclosure.
Figure 4:
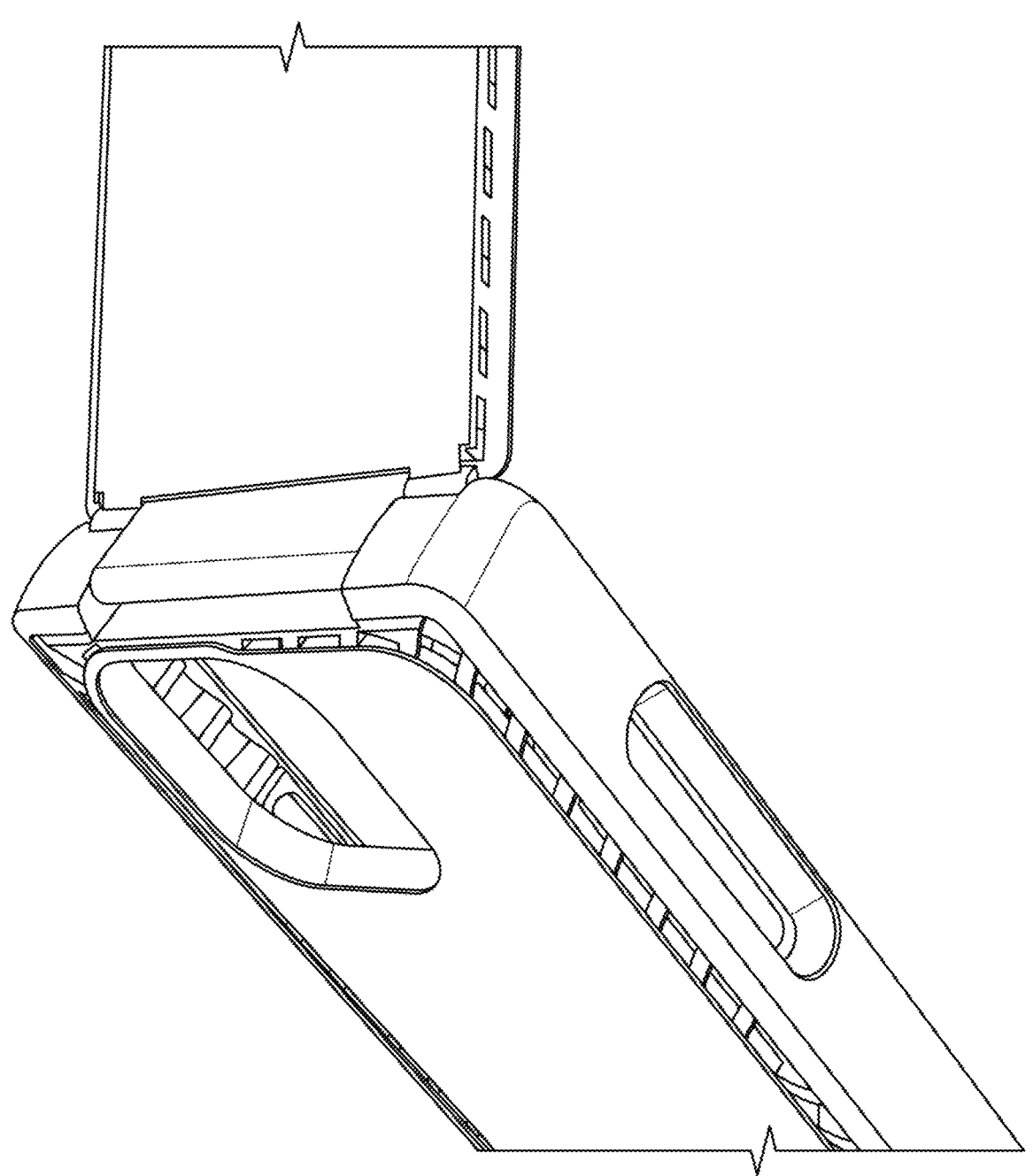
FIG. 4 is a rear isometric perspective view of a mobile device thermally insulating protective cover with the hard lid partially open, as contemplated by the present disclosure.
Figure 5:
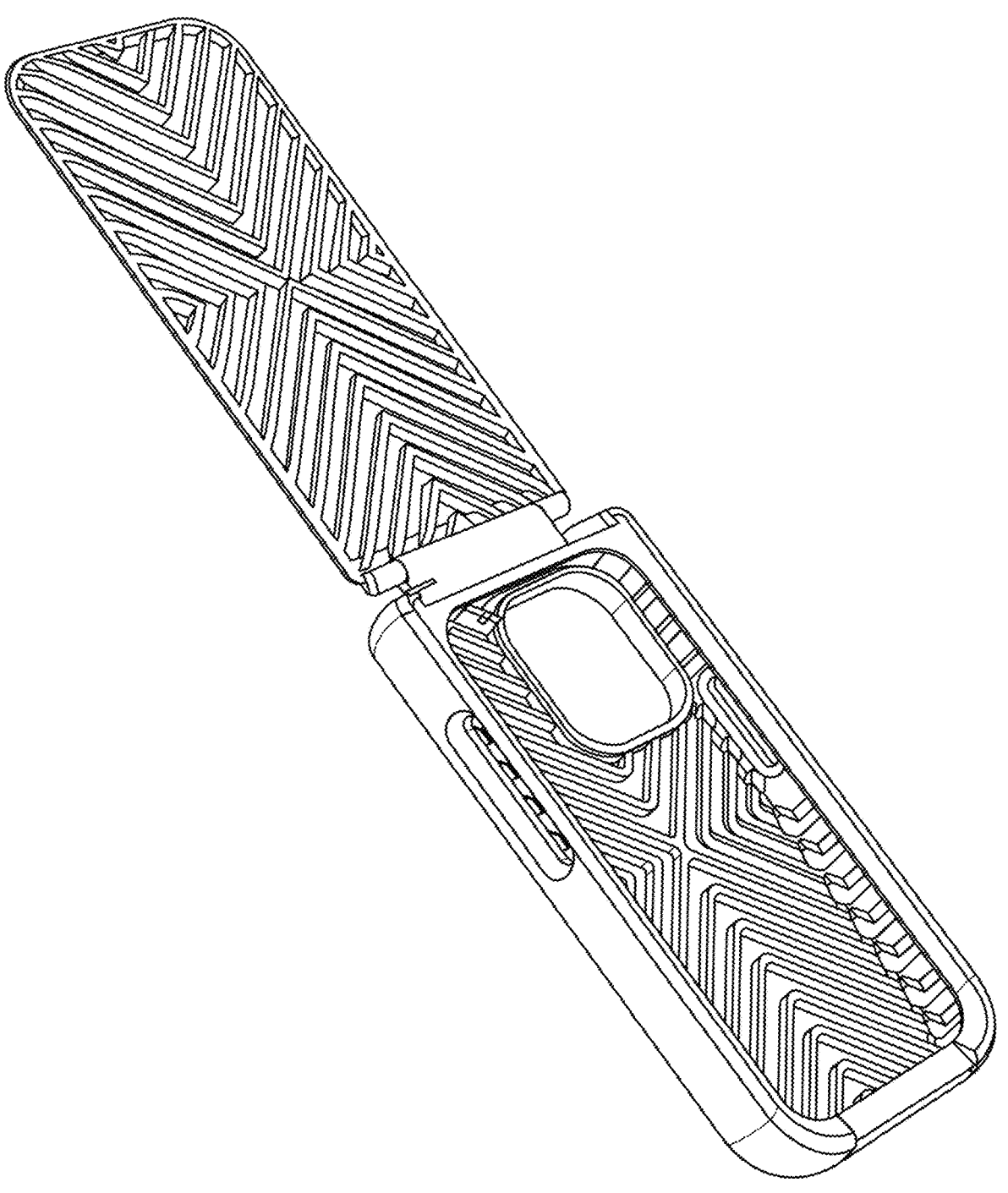
FIG. 5 is a front isometric perspective view of a mobile device thermally insulating protective cover with the hard lid half open, as contemplated by the present disclosure.
Figure 6:
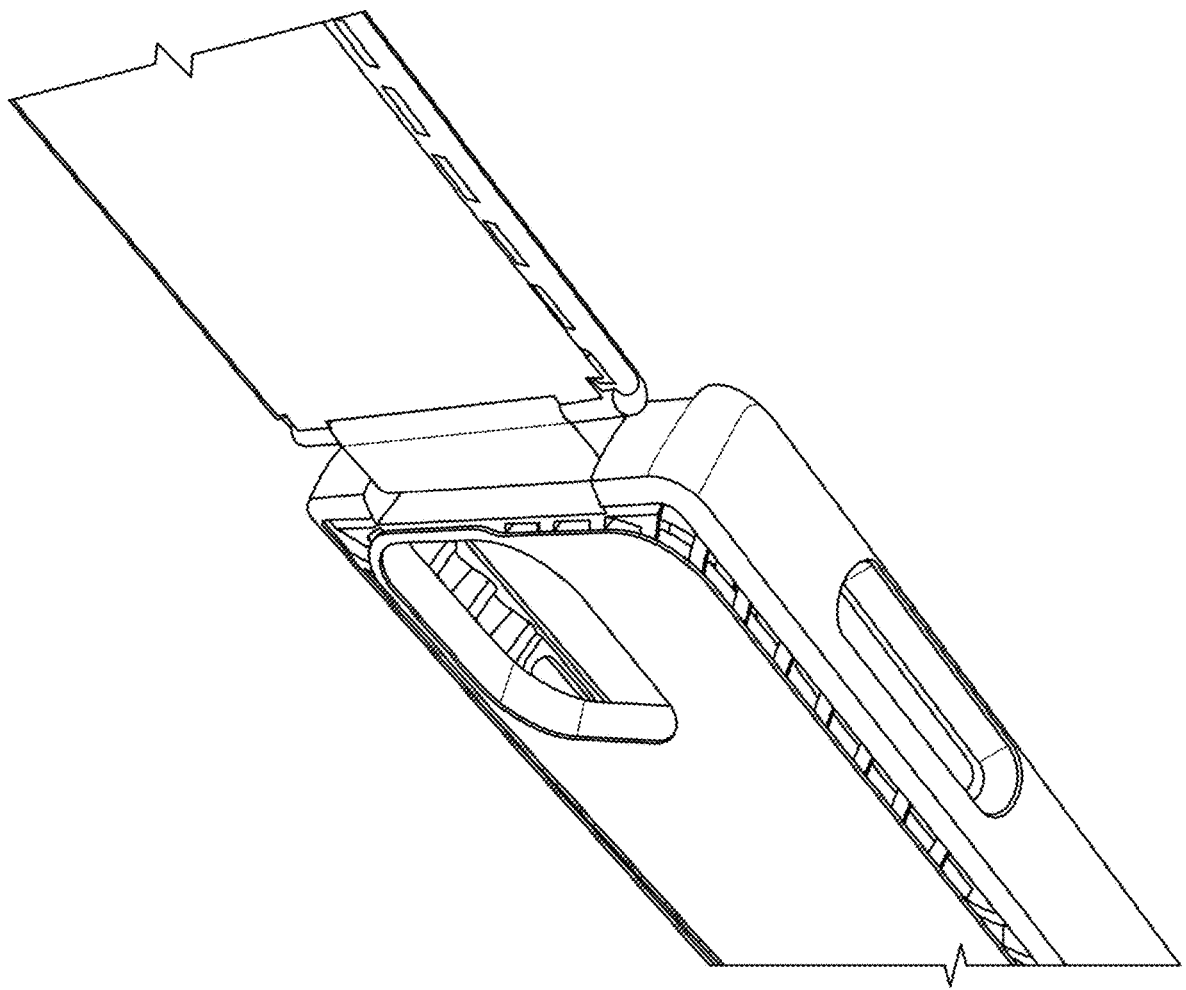
FIG. 6 is a rear isometric perspective view of a mobile device thermally insulating protective cover with the hard lid half open, as contemplated by the present disclosure.
Figure 7:
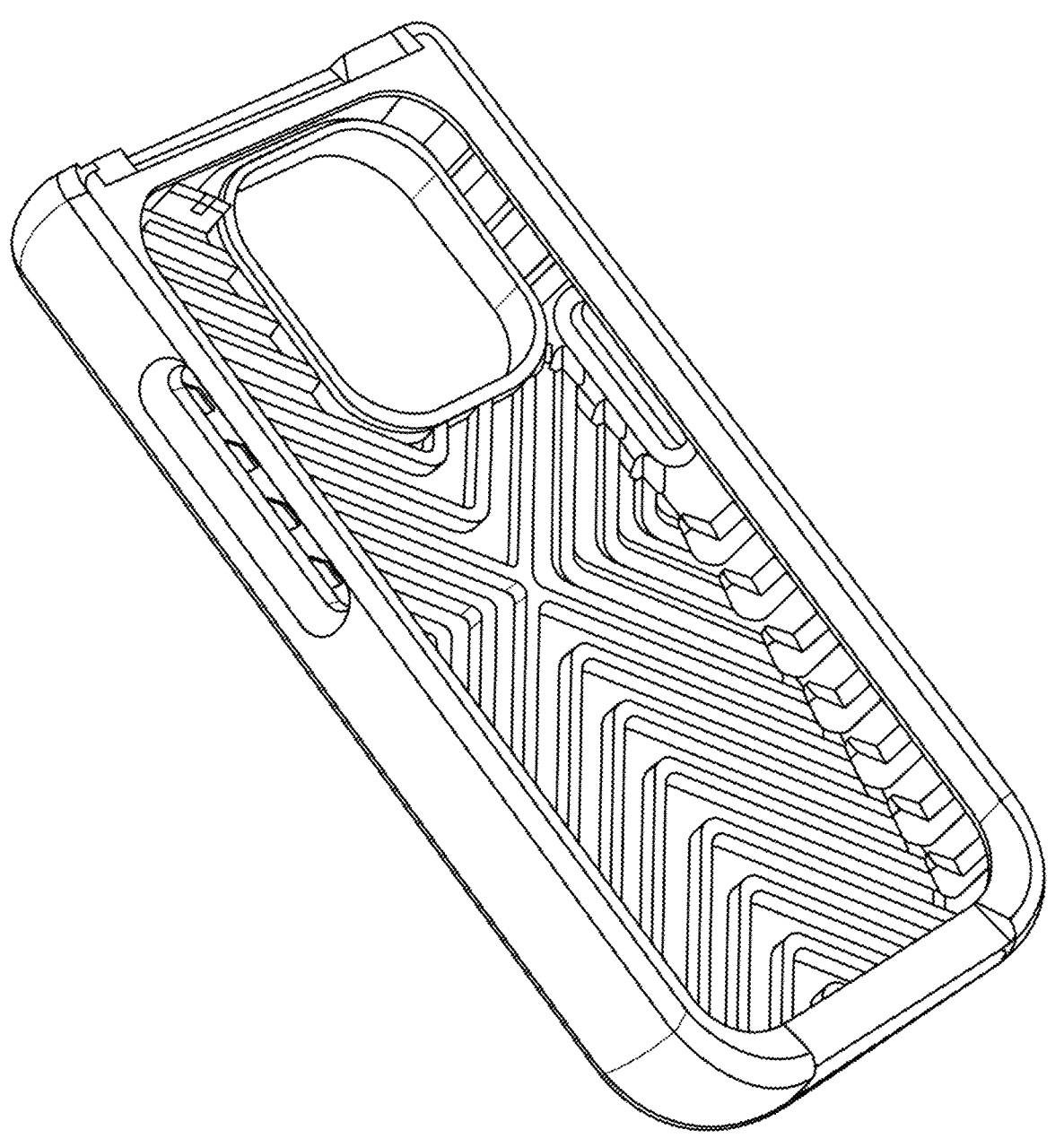
FIG. 7 is a front isometric perspective view of a mobile device thermally insulating protective cover with the hard lid fully open, as contemplated by the present disclosure.
Figure 8:
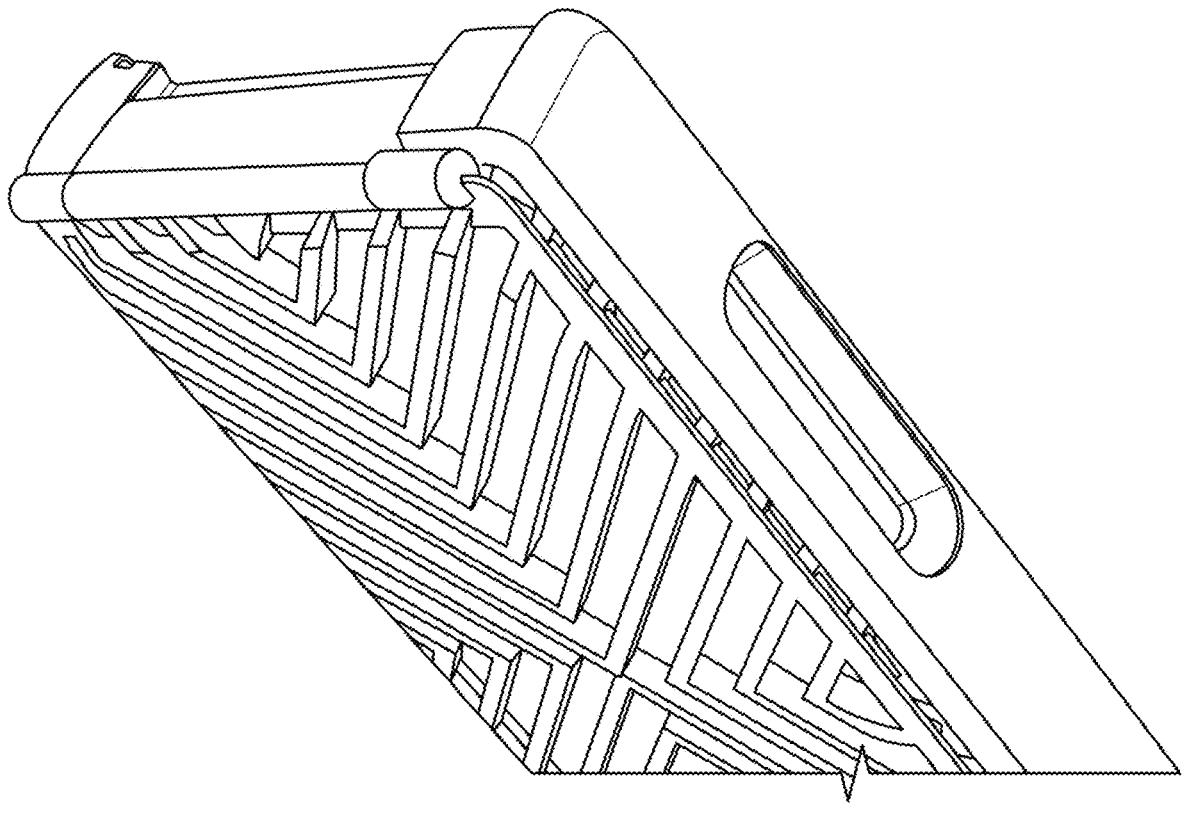
FIG. 8 is a rear isometric perspective view of a mobile device thermally insulating protective cover with the hard lid fully open, as contemplated by the present disclosure.
Figure 9:
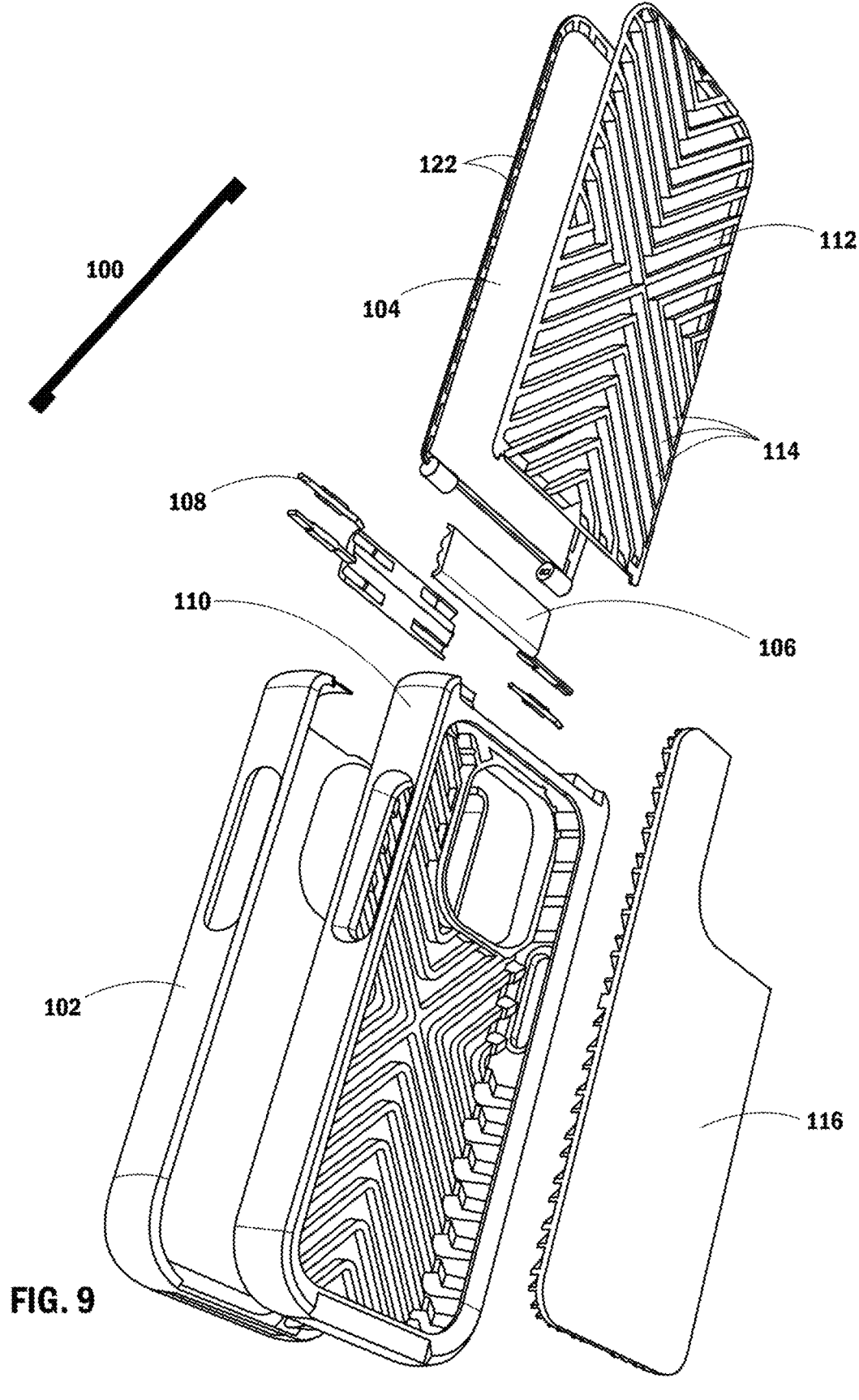
FIG. 9 is an exploded component view of a mobile device thermally insulating protective cover, as contemplated by the present disclosure.
Figure 10:
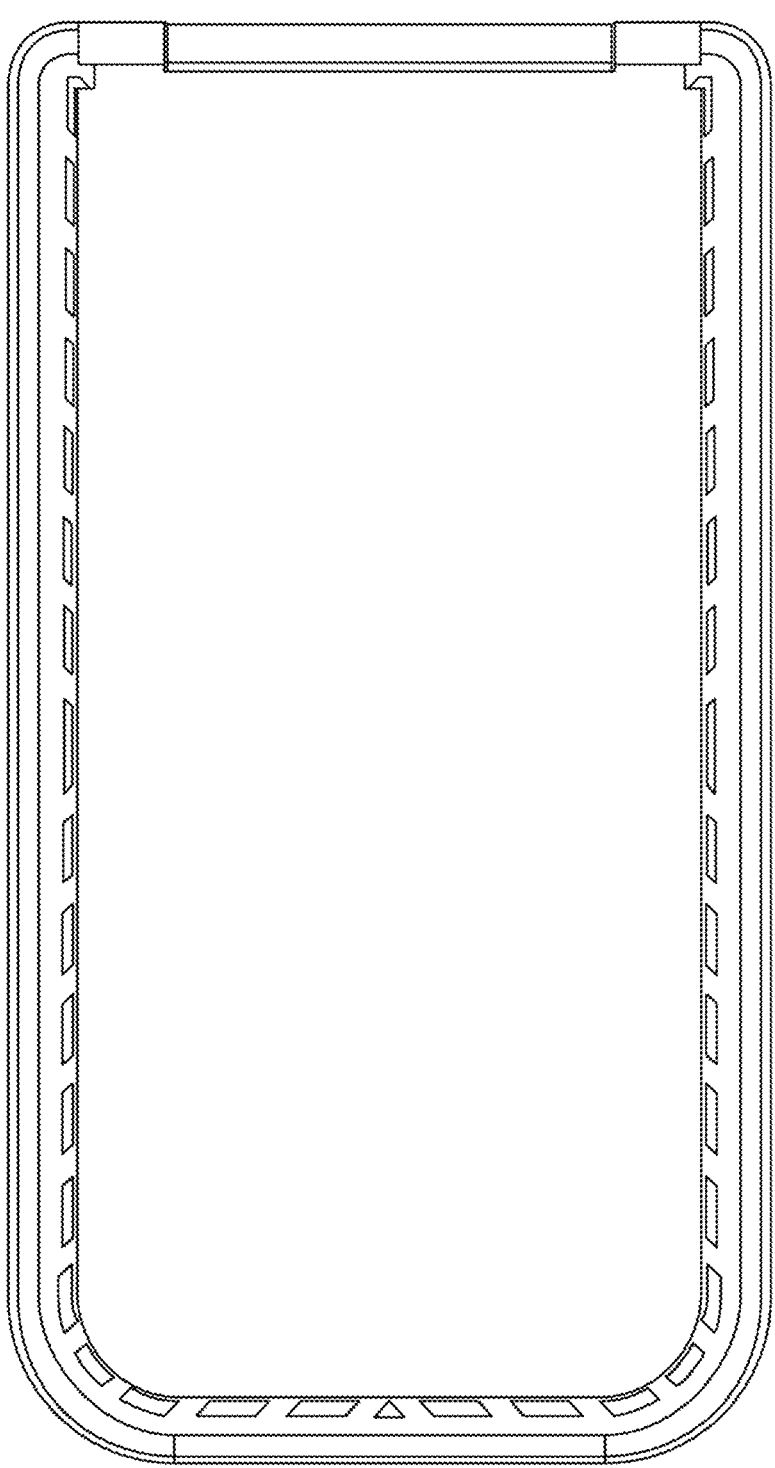
FIG. 10 is a front plan view of a mobile device thermally insulating protective cover, as contemplated by the present disclosure.
Figure 11:
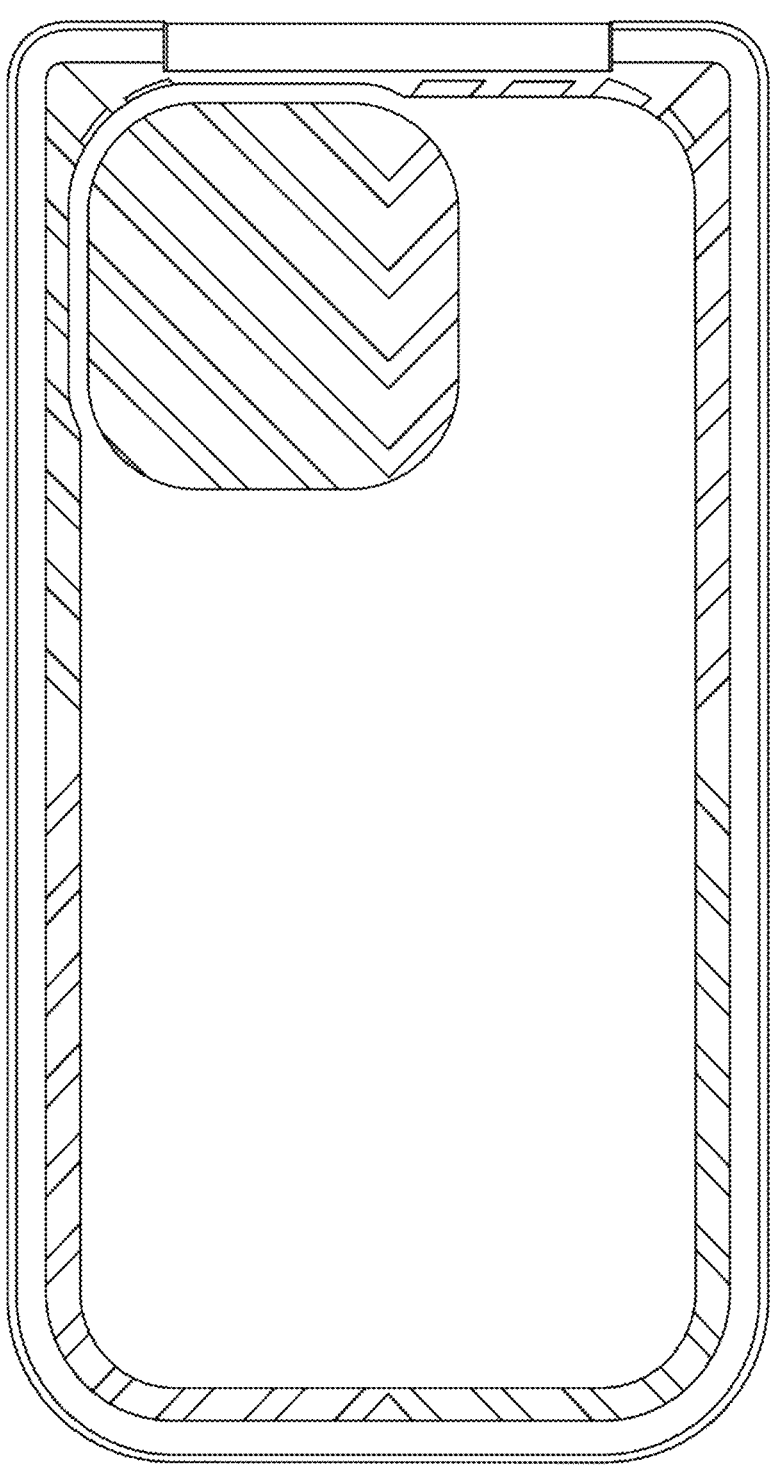
FIG. 11 is a rear plan view of a mobile device thermally insulating protective cover, as contemplated by the present disclosure.
Figure 14:
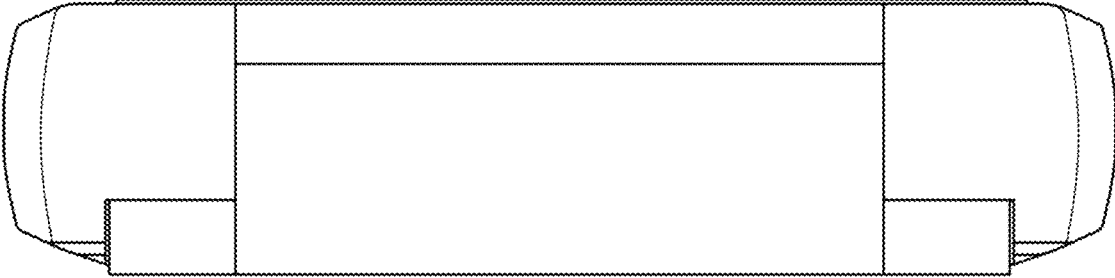
FIG. 14 is a top side elevation view of a mobile device thermally insulating protective cover, as contemplated by the present disclosure.
Figure 15:
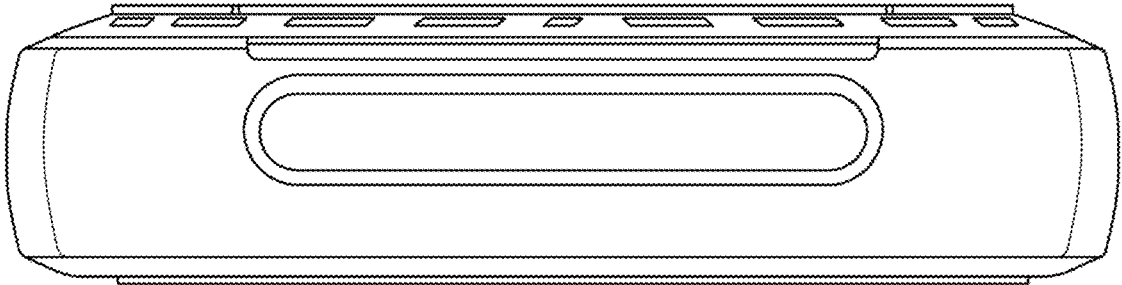
FIG. 15 is a bottom side elevation view of a mobile device thermally insulating protective cover, as contemplated by the present disclosure.
Figure 16:
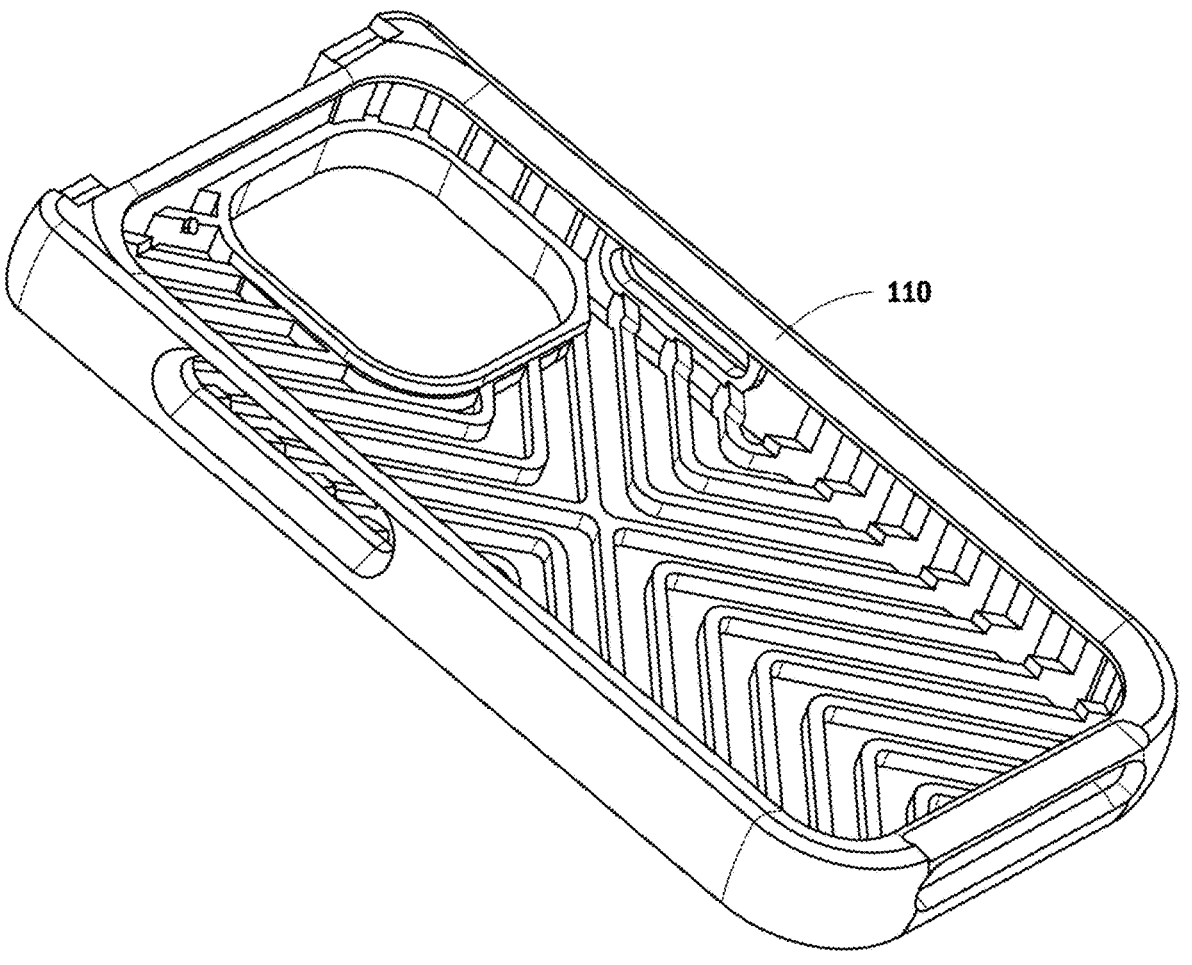
FIG. 16 is an isometric perspective view of a mobile device thermally insulating protective cover soft case, as contemplated by the present disclosure.
Figure 17:
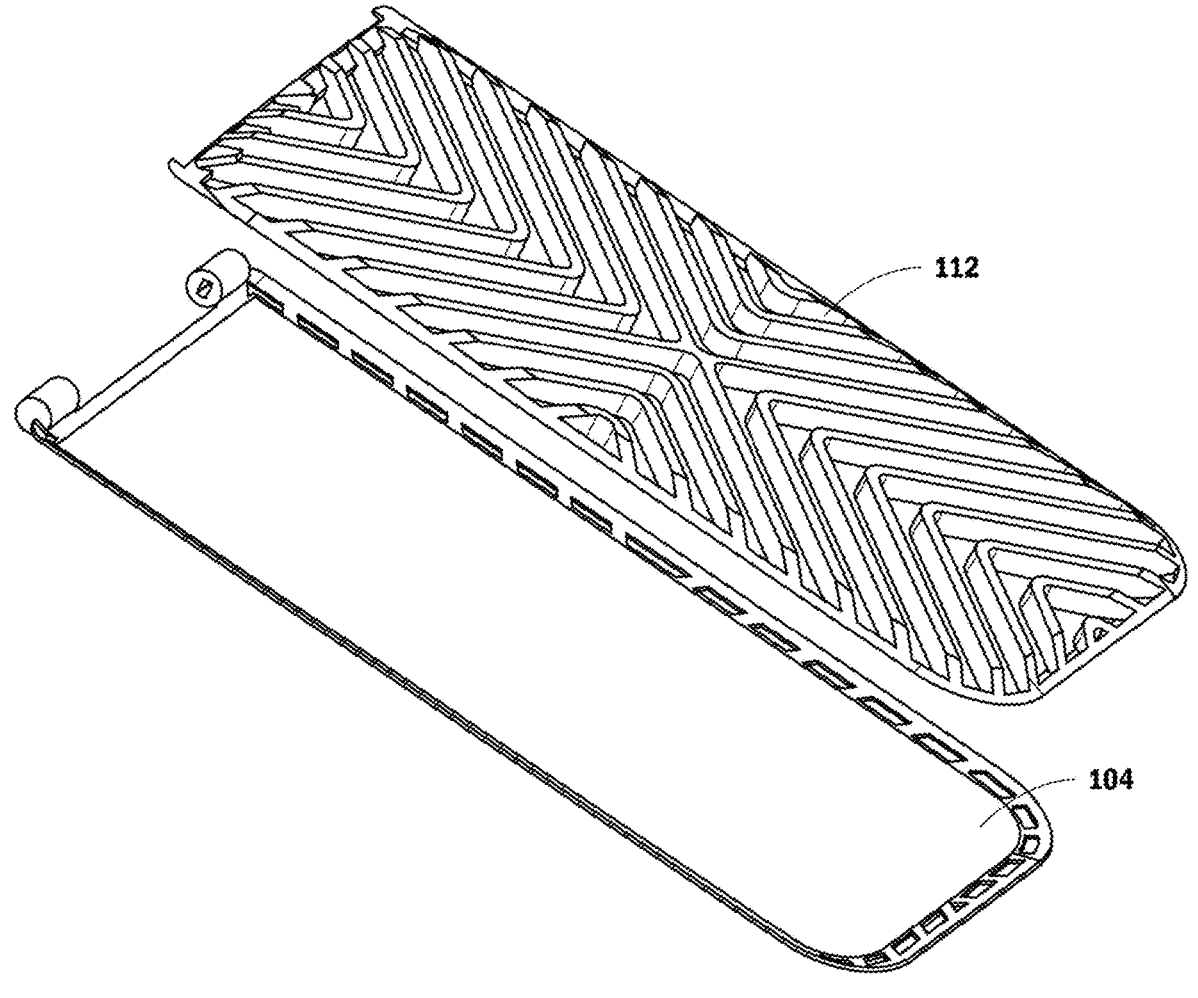
FIG. 17 is an isometric perspective view of a mobile device thermally insulating protective cover hard lid and soft lid, as contemplated by the present disclosure.
Figure 18:
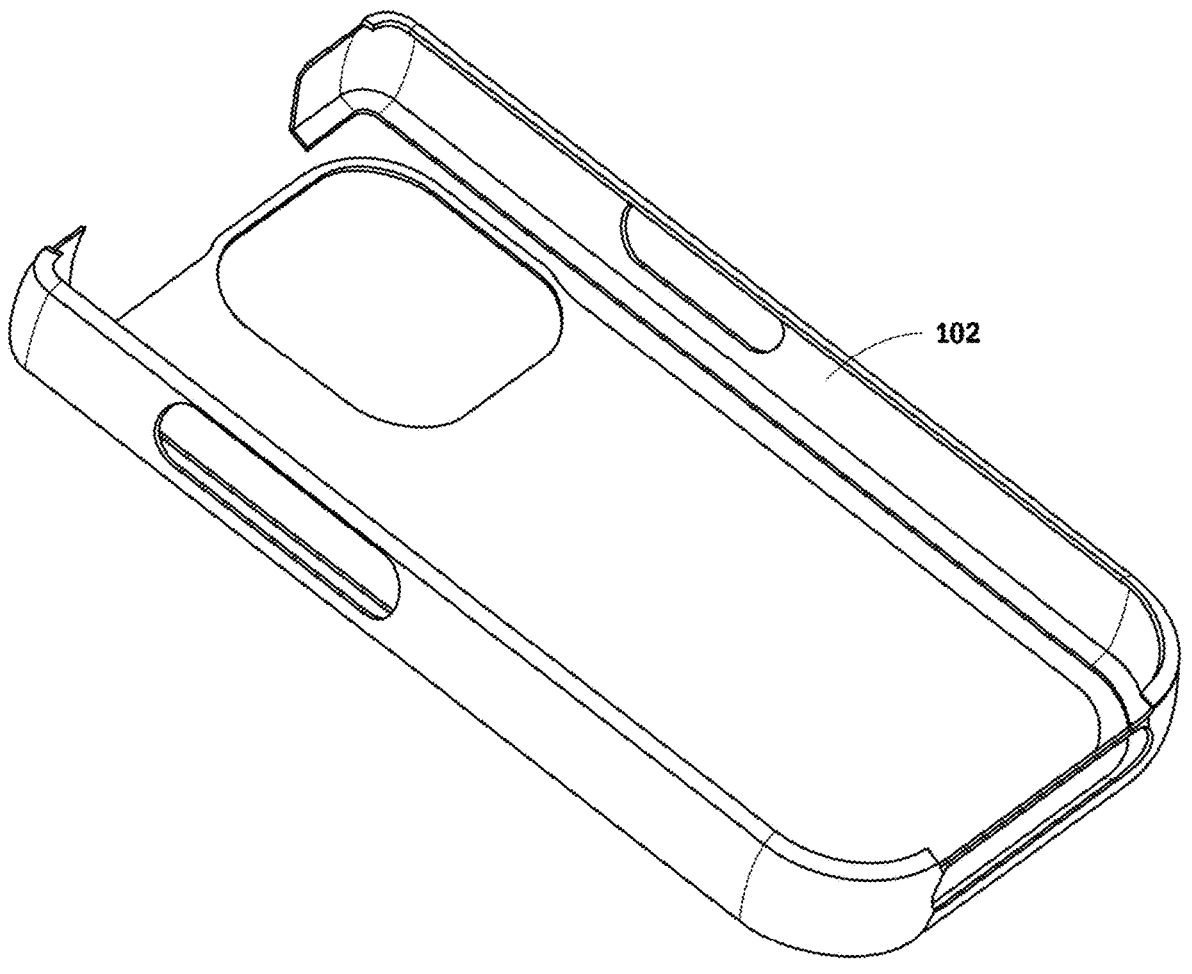
FIG. 18 is an isometric perspective view of a mobile device thermally insulating protective cover hard case, as contemplated by the present disclosure.
Figure 19:
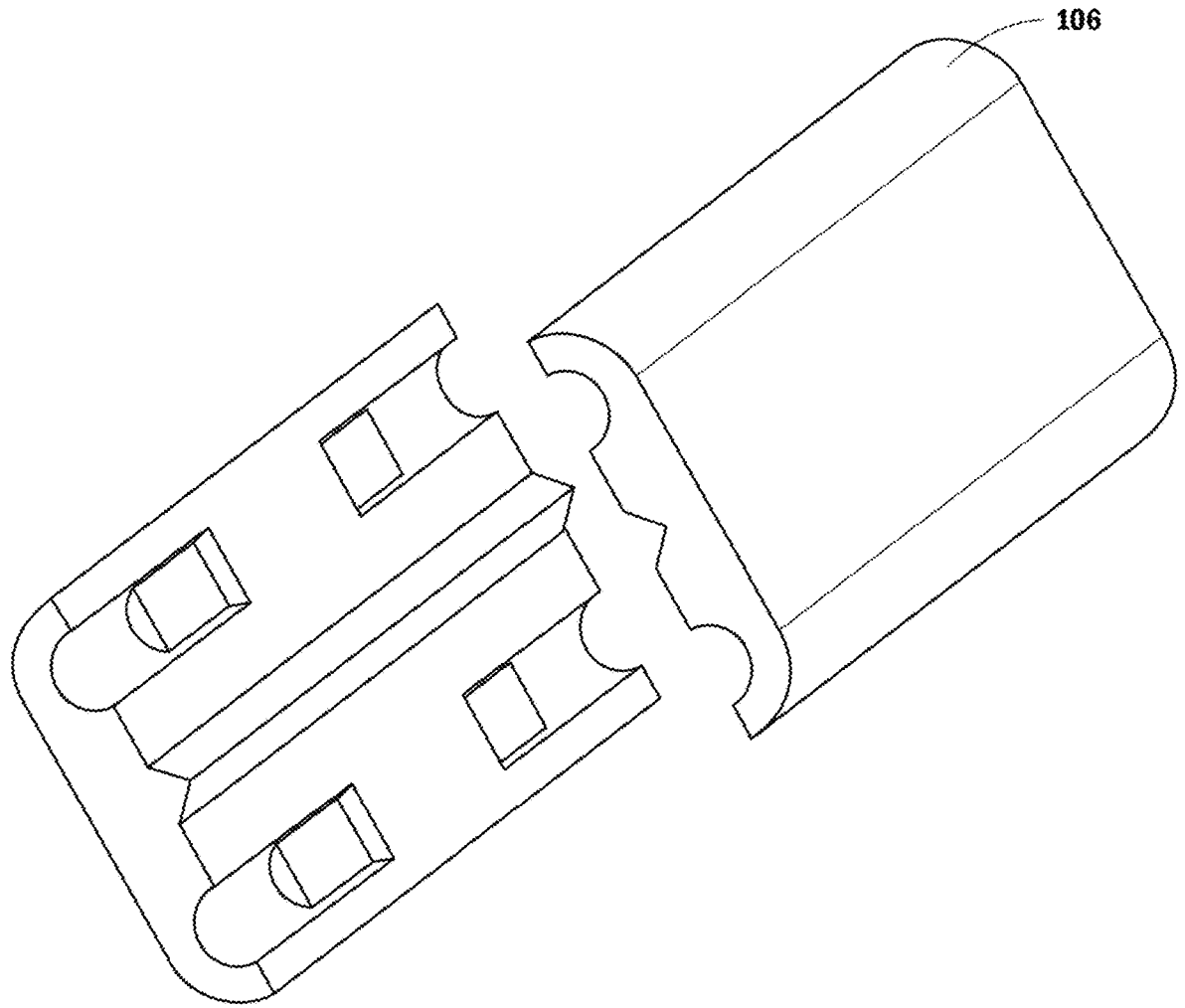
FIG. 19 is an isometric perspective view of a mobile device thermally insulating protective cover double hinge joint, as contemplated by the present disclosure.
Figure 20:
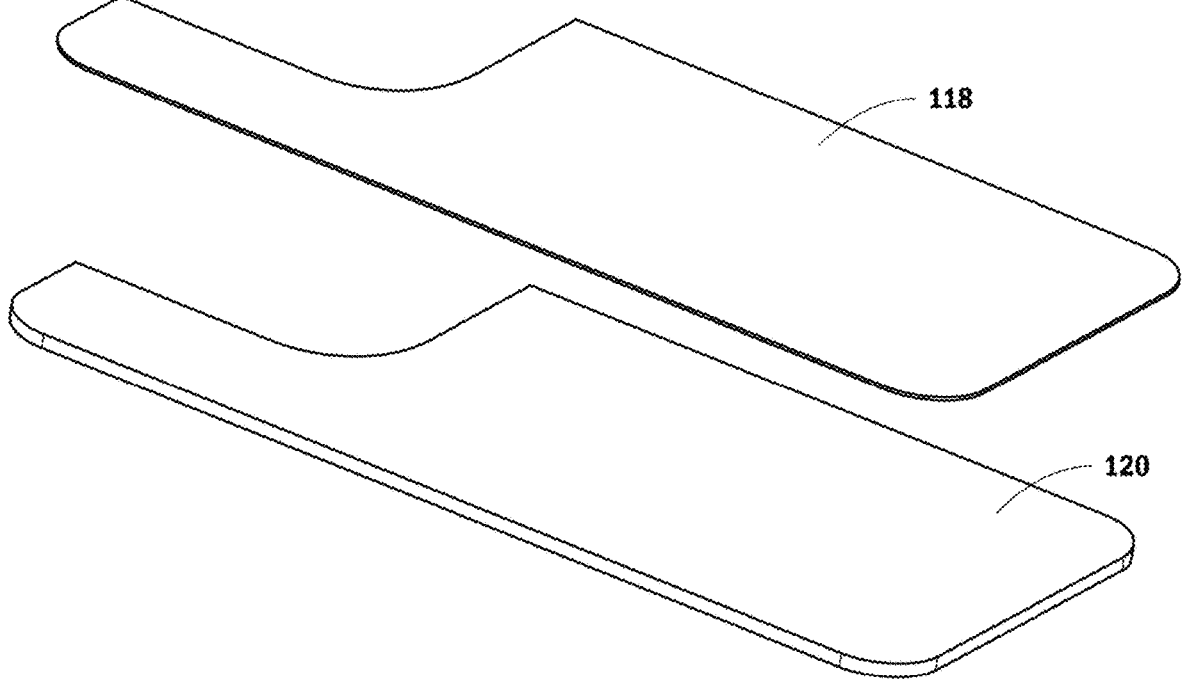
FIG. 20 is an isometric perspective view of a mobile device thermally insulating protective cover first cooling layer, as contemplated by the present disclosure.
Figure 21:
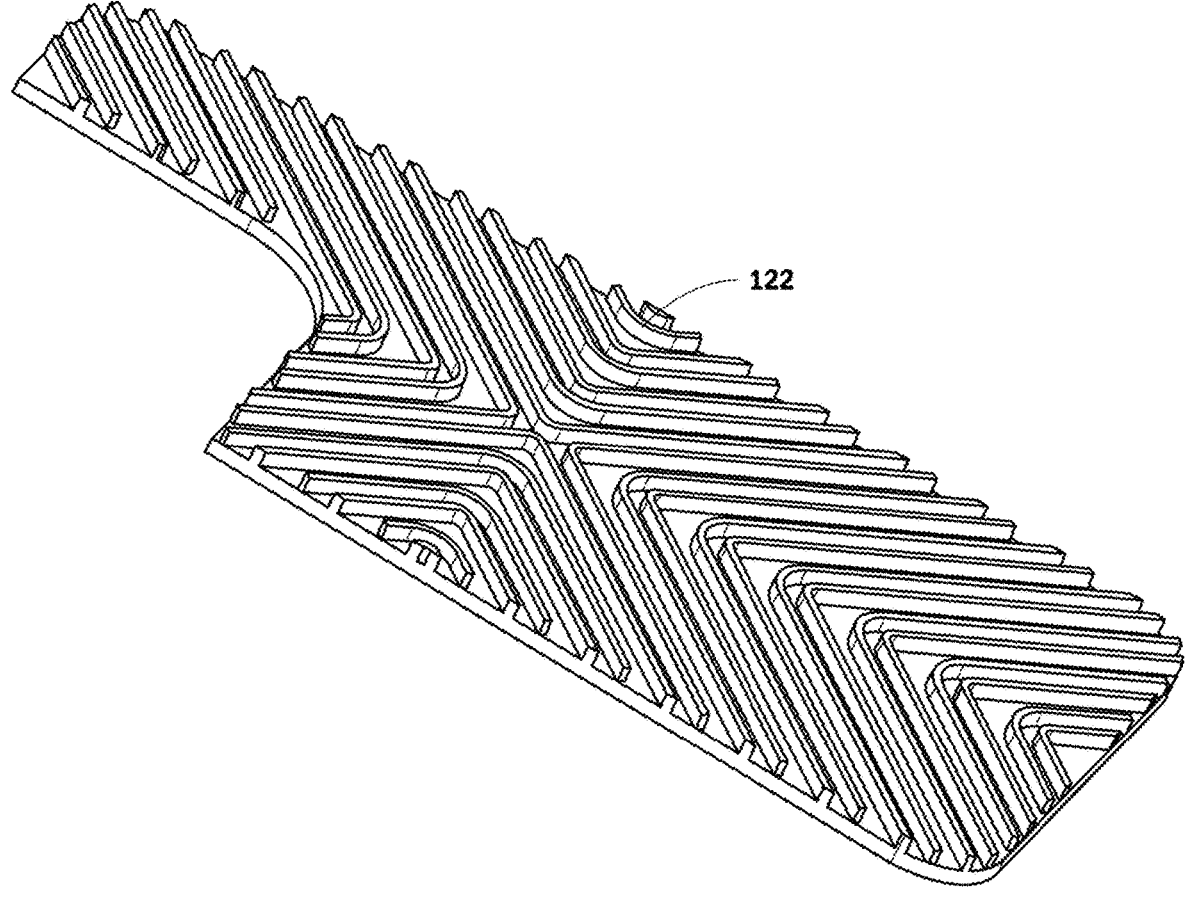
FIG. 21 is an isometric perspective view of a mobile device thermally insulating protective cover second cooling layer, as contemplated by the present disclosure.

The illustrations of FIGS. 1-21 illustrate a mobile device thermally insulating protective cover, as contemplated by the present disclosure. The device may comprise, generally, a main body 100 comprising a device protective case and a cover lid.

The device protective case may comprise any appropriate mobile device case suitable for enclosing the sides and back of a given mobile device, such as a mobile phone or tablet. The device protective case may further comprise a hard case 102, which may comprise any case appropriate for enclosing and protecting a mobile device. The hard case 102 may comprise a rear side, a top side, a bottom side, a left side, a right side, and an internal cavity. The hard case 102 may further comprise a plurality of openings in the various sides to allow a user of the mobile device to interact with the various buttons of the mobile device, connect plugs and cables to the mobile device, and use the cameras or lights of the mobile device.

The device protective case may further comprise a soft case 110, which may comprise any case appropriate for enclosing and insulating a mobile device. The soft case 110 may comprise a rear side, a top side, a bottom side, a left side, a right side, and an internal cavity. The soft case 110 may further comprise a plurality of openings in the various sides to allow a user of the mobile device to interact with the various buttons of the mobile device, connect plugs and cables to the mobile device, and use the cameras or lights of the mobile device.

The soft case 110 may be inserted into the internal cavity of the hard case 102, and a mobile device may be inserted into the internal cavity of the soft case 110. By this design a mobile device may be inserted into the mobile device thermally insulating protective cover and may be enclosed on its sides and rear by the device protective case.

The top side of the hard case 102 may further comprise a receiver for a plurality of hinges 108, and the plurality of hinges 108 may be attached to a double hinge joint 106. In this way the double hinge joint 106 may articulate around the plurality of hinges 108 relative to the hard case 102.

The cover lid may comprise any appropriate mobile device cover suitable for enclosing the front of a given mobile device, such as a mobile phone or tablet. The cover lid may further comprise a hard lid 104, which may comprise any lid appropriate for enclosing and protecting a mobile device. The hard lid 104 may comprise a front side, a top side, a bottom side, a left side, and a right side.

The cover lid may further comprise a soft lid 112, which may comprise any lid appropriate for enclosing and insulating a mobile device. The soft lid 112 may comprise a front side, a top side, a bottom side, a left side, and a right side.

The soft lid 111 may be attached to an inner side of the hard lid 104. By this design a screen of a mobile device may be covered by the mobile device thermally insulating protective cover.

The top side of the hard lid 104 may further comprise a receiver for a plurality of hinges 108, and the plurality of hinges 108 may be attached to a double hinge joint 106. In this way the double hinge joint 106 may articulate around the plurality of hinges 108 relative to the hard lid 104 and the hard lid 104 may articulate around the double hinge joint 106 relative to the hard case 102. In a closed orientation the hard lid 104 may be in contact with the hard case 102 creating an enclosed space into which a mobile device may be contained. By the design of the double hinge joint 106 the hard lid 104 may be partially opened or completely opened relative to the hard case 102, allowing the hard lid 104 to articulate approximately three hundred and sixty degrees and come into contact with the back of the hard case 102.

The mobile device thermally insulating protective cover may further comprise a plurality of cooling channels 114, which may comprise a plurality of ridges and valleys integrated into the various soft components of the device. In one embodiment the soft lid 112 may comprise a plurality of cooling channels 114 in connection with a plurality of vent holes 122 in the hard lid 104. By this design the device may allow for air flow through the hard lid 104 and cross a mobile device contained therein. In another embodiment the soft case 110 may comprise a plurality of cooling channels 114 in physical contact with the mobile device therein. By this design the device may allow for heat transfer from the mobile device to the soft case 110.

The mobile device thermally insulating protective cover may further comprise a cooling layer 116, which may comprise a layer of thermal material designed for heat absorption and distribution. In one embodiment the cooling layer 116 may comprise a combination of carbon sheet 118 and a hydrogel layer 120. In another embodiment the cooling layer 116 may comprise an aluminum layer 122. By these designs the cooling layer 116 may allow for heat transfer from the mobile device to the cooling layer 116.

To begin using the mobile device thermally insulating protective cover a user may insert the soft case 110 into the hard case 102. The user may then insert the cooling layer 116 into the soft case 110, and may then insert a mobile device into the soft case 110. By this design the cooling layer 116 may be positioned between the mobile device and the soft case 110. The user may then articulate the hard lid 104 to a closed position causing the soft lid 112 to come in contact with a front side of the mobile device. By this design the mobile device is completely enclosed by the protective cover.

The mobile device thermally insulating protective cover may be substantially assembled by any appropriate mechanism known in the art. By way of example, the various components of the device may be attached to one another, as contemplated by the present disclosure, by screwing, gluing, welding, adhering, interlocking, clasping, binding, nailing, or any other appropriate mechanism.

The mobile device thermally insulating protective cover may be substantially constructed of any suitable material or combination of materials, but typically is constructed of a resilient material or combination of materials such that the device is resistant to damage as a result of compression, twisting, heating, or submersion in water. As an example, and without limiting the scope of the present invention, various exemplary embodiments of the mobile device thermally insulating protective cover may be substantially constructed of one or more materials of steel, aluminum, brass, fiberglass, carbon fiber, plastic, acrylic, polycarbonate, polyester, nylon, denim, cotton, silicone, or combinations thereof. In some embodiments the various components of the device may be coated, lined, or otherwise insulated to prevent contamination of the device. In one embodiment the material of construction may vary from one component to the next within the system.

In one embodiment the mobile device thermally insulating protective cover may comprise a resilient material of construction that either comprises a material having antimicrobial properties or comprises a layering of antimicrobial material or coating. Antimicrobial properties comprise the characteristic of being antibacterial, biocidal, microbicidal, anti-fungal, anti-viral, or other similar characteristics, and the oligodynamic effect, which is possessed by copper, brass, silver, gold, and several other metals and alloys, is one such characteristic. Copper and its alloys, in particular, have exceptional self-sanitizing effects. Silver also has this effect, and is less toxic to users than copper. Some materials, such as silver in its metallic form, may require the presence of moisture to activate the antimicrobial properties.

While the invention has been described in connection with what is presently considered to be the most practical and preferred embodiments, it is to be understood that the invention is not to be limited to the disclosed embodiments, but, on the contrary, is intended to cover various modifications and equivalent arrangements included within the spirit and scope of the appended claims.

I claim:

1. A mobile device thermally insulating protective cover, comprising: a hard case; a soft case; a hard lid; a soft lid; a double hinge joint; and a plurality of hinges; wherein said soft case is inserted within said hard case; wherein said soft lid is attached to said hard lid; wherein a first side of said double hinge joint is attached to a top side of said hard case by said plurality of hinges; wherein a second side of said double hinge joint is attached to a top side of said hard lid by said plurality of hinges; wherein said soft case further comprises a plurality of cooling channels; and wherein said soft lid further comprises a plurality of cooling channels.

2. The mobile device thermally insulating protective cover of claim 1, further comprising: a cooling layer.

3. The mobile device thermally insulating protective cover of claim 2, wherein said hard lid further comprises a plurality of vent holes.

4. The mobile device thermally insulating protective cover of claim 3, wherein said cooling layer further comprises a graphite sheet and a hydrogel layer.

5. The mobile device thermally insulating protective cover of claim 3, wherein said cooling layer further comprises an aluminum layer.

\* \* \* \* \*